(12) United States Patent
Takahashi

(10) Patent No.: US 8,927,307 B2
(45) Date of Patent: Jan. 6, 2015

(54) LIGHT EMITTING DEVICE AND ELECTRONIC DEVICE

(71) Applicant: Semiconductor Energy Laboratory Co., Ltd., Kanagawa-ken (JP)

(72) Inventor: Masahiro Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/914,785

(22) Filed: Jun. 11, 2013

(65) Prior Publication Data

US 2013/0273675 A1    Oct. 17, 2013

Related U.S. Application Data

(63) Continuation of application No. 11/711,968, filed on Feb. 28, 2007, now abandoned.

(30) Foreign Application Priority Data

Mar. 3, 2006    (JP) ................................. 2006-058753

(51) Int. Cl.
| | | |
|---|---|---|
| H01L 33/58 | (2010.01) | |
| H05B 33/26 | (2006.01) | |
| H05B 33/10 | (2006.01) | |
| H01L 27/32 | (2006.01) | |
| H01L 51/52 | (2006.01) | |

(52) U.S. Cl.
CPC ............. *H01L 33/58* (2013.01); *H01L 27/3244* (2013.01); *H01L 51/5206* (2013.01); *H05B 33/26* (2013.01); *H05B 33/10* (2013.01); *H01L 51/5275* (2013.01); *H01L 51/5268* (2013.01); *H01L 51/5215* (2013.01)
USPC ...................... 438/29; 257/E33.074; 264/496

(58) Field of Classification Search
USPC ................ 257/79–103, E33.074; 438/22–47; 264/299–338, 494, 496; 313/509, 512
See application file for complete search history.

(56) References Cited

U.S. PATENT DOCUMENTS

| 5,771,328 A | 6/1998 | Wortman et al. |
| 6,294,313 B1 | 9/2001 | Kobayashi et al. |

(Continued)

FOREIGN PATENT DOCUMENTS

| CN | 1510974 A | 7/2004 |
| CN | 1538537 A | 10/2004 |

(Continued)

OTHER PUBLICATIONS

Office Action re Chinese application No. CN 200710087629.4, dated Aug. 21, 2009 (with English translation).

(Continued)

*Primary Examiner* — Steven J Fulk
*Assistant Examiner* — Eric Ward
(74) *Attorney, Agent, or Firm* — Husch Blackwell LLP

(57) ABSTRACT

To improve light extraction efficiency of light emitting elements such as electroluminescent elements. A first electrode 101, a light emitting layer 102, and a second electrode 103 are formed over a substrate 100, which partially constitute a light emitting element. Light produced in the light emitting layer 102 is emitted out through the second electrode 103. A plurality of three-dimensional bodies 104 are provided in contact with a surface of the second electrode 103. With the provision of the bodies 104, light totally reflected between the second electrode 103 and the air enters the bodies 104 and can be emitted through faces of the bodies 104 that are not parallel to the interface between the bodies and the second electrode 103.

9 Claims, 13 Drawing Sheets

(56) References Cited

U.S. PATENT DOCUMENTS

| | | | |
|---|---|---|---|
| 6,309,580 B1 * | 10/2001 | Chou | 264/338 |
| 6,617,784 B1 | 9/2003 | Abe et al. | |
| 6,777,871 B2 | 8/2004 | Duggal et al. | |
| 6,783,719 B2 * | 8/2004 | Robinson et al. | 264/300 |
| 6,787,796 B2 | 9/2004 | Do et al. | |
| 6,844,672 B2 | 1/2005 | Yamazaki | |
| 6,882,102 B2 | 4/2005 | Yamazaki | |
| 6,943,117 B2 * | 9/2005 | Jeong et al. | 438/694 |
| 7,001,060 B1 | 2/2006 | Kimura | |
| 7,084,565 B2 | 8/2006 | Cho et al. | |
| 7,102,175 B2 | 9/2006 | Orita | |
| 7,148,502 B2 | 12/2006 | Yamazaki et al. | |
| 7,391,151 B2 | 6/2008 | Koo et al. | |
| 7,432,634 B2 | 10/2008 | Choi et al. | |
| 7,520,742 B2 | 4/2009 | Motowaki et al. | |
| 7,589,461 B2 | 9/2009 | Park et al. | |
| 7,687,007 B2 | 3/2010 | Ling et al. | |
| 8,013,514 B2 | 9/2011 | Park et al. | |
| 2001/0035713 A1 | 11/2001 | Kimura | |
| 2003/0164496 A1 | 9/2003 | Do et al. | |
| 2004/0018797 A1 | 1/2004 | Murakami et al. | |
| 2004/0195962 A1 | 10/2004 | Nakamura et al. | |
| 2004/0202865 A1 * | 10/2004 | Homola et al. | 428/421 |
| 2004/0206969 A1 * | 10/2004 | Orita | 257/97 |
| 2004/0217702 A1 | 11/2004 | Garner et al. | |
| 2005/0023967 A1 | 2/2005 | Gotoh et al. | |
| 2005/0035708 A1 | 2/2005 | Yamazaki et al. | |
| 2005/0073243 A1 | 4/2005 | Yamazaki et al. | |
| 2005/0082700 A1 * | 4/2005 | Deeman et al. | 264/2.5 |
| 2005/0116625 A1 | 6/2005 | Park et al. | |
| 2005/0142379 A1 | 6/2005 | Juni et al. | |
| 2005/0194896 A1 | 9/2005 | Sugita et al. | |
| 2005/0196528 A1 | 9/2005 | Akiyoshi | |
| 2005/0287820 A1 | 12/2005 | Ling et al. | |
| 2006/0049745 A1 | 3/2006 | Handa et al. | |
| 2006/0125388 A1 | 6/2006 | Song et al. | |
| 2006/0255505 A1 * | 11/2006 | Sandhu et al. | 264/293 |
| 2006/0267034 A1 | 11/2006 | Orita | |
| 2007/0037307 A1 * | 2/2007 | Donofrio | 438/42 |
| 2007/0120136 A1 | 5/2007 | Noda et al. | |
| 2007/0200496 A1 | 8/2007 | Cok et al. | |
| 2007/0267764 A1 | 11/2007 | Morimoto | |
| 2008/0018231 A1 | 1/2008 | Hirakata | |
| 2008/0220683 A1 | 9/2008 | Koo et al. | |
| 2009/0291237 A1 | 11/2009 | Park et al. | |

FOREIGN PATENT DOCUMENTS

| | | |
|---|---|---|
| EP | 1 603 367 A1 | 12/2005 |
| EP | 1 615 472 A1 | 1/2006 |
| JP | 2002-50471 | 2/2002 |
| JP | 2002-151274 | 5/2002 |
| JP | 2002-278477 | 9/2002 |
| JP | 2003-154546 | 5/2003 |
| JP | 2004-14385 | 1/2004 |
| JP | 2004-152663 | 5/2004 |
| JP | 2004-303724 | 10/2004 |
| JP | 2004-311419 | 11/2004 |
| JP | 2005-166635 | 6/2005 |
| JP | 2005-313484 A | 11/2005 |
| JP | 2005-327788 | 11/2005 |
| JP | 2006-32088 | 2/2006 |
| JP | 2006-332019 | 12/2006 |
| KR | 2003-0070985 | 9/2003 |
| TW | 200505281 | 2/2005 |
| WO | WO 2004/000567 A1 | 12/2003 |

OTHER PUBLICATIONS

Search Report re European application No. EP 07003167.9, dated Feb. 6, 2012.

Office Action re Korean application No. KR 10-2007-0019557, dated Jan. 22, 2013 (with English translation).

Chinese Office Action re Application No. CN 201110339426.6, dated Mar. 24, 2014.

Office Action re Taiwanese application No. TW 096107036, date Jun. 28, 2013 (with English translation).

* cited by examiner

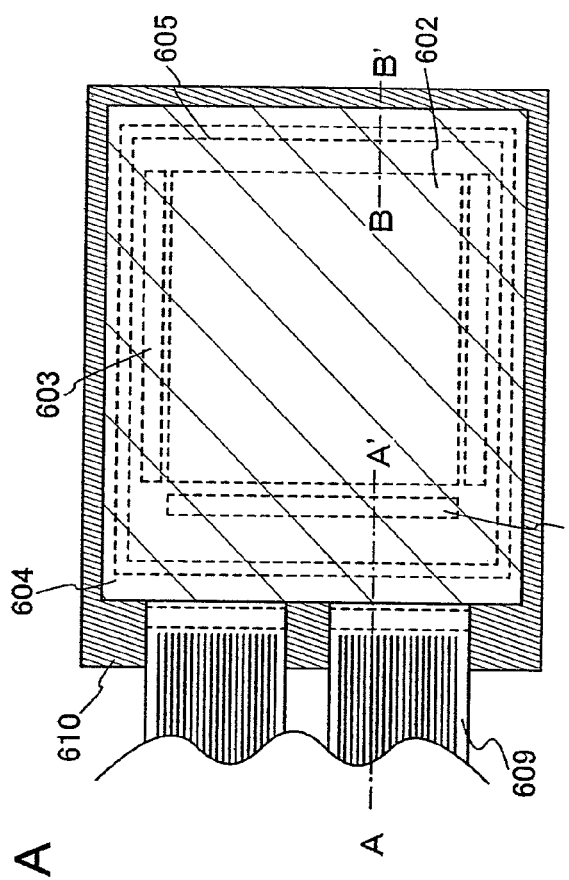
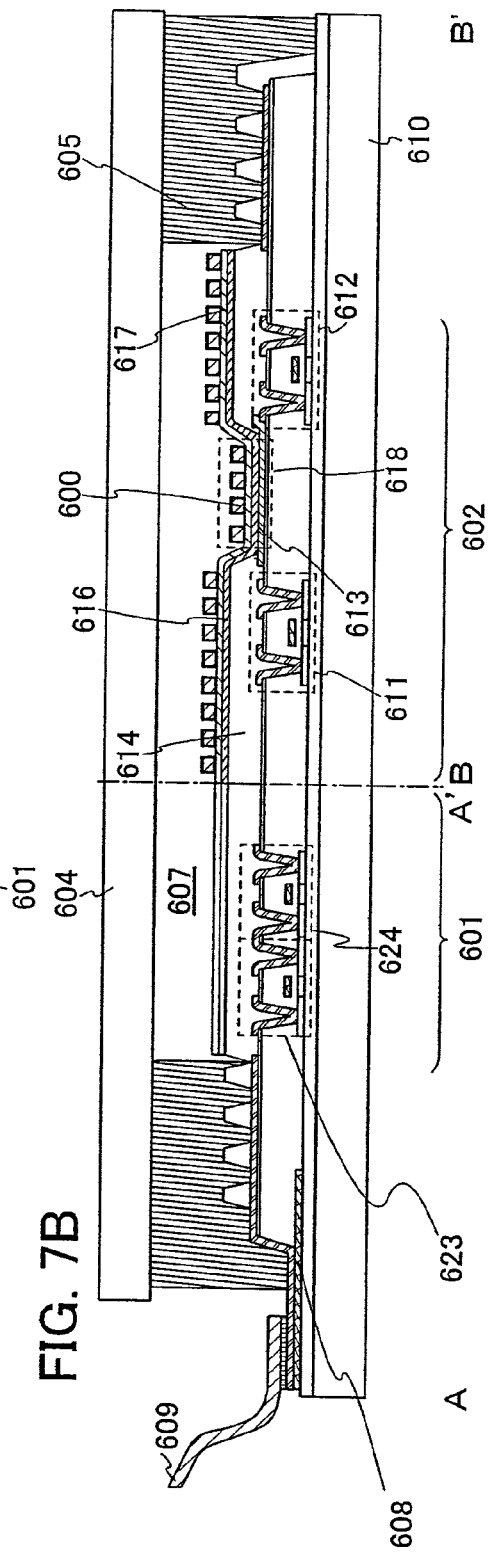
FIG. 7A
FIG. 7B

LIGHT EMITTING DEVICE AND ELECTRONIC DEVICE

This application is a continuation of application Ser. No. 11/711,968 filed on Feb. 28, 2007, which is incorporated by reference herein.

BACKGROUND OF THE INVENTION

1. Field of the Invention

The present invention relates to a device from which light transmitted through an electrode can be obtained. For example, the invention relates to a light emitting device provided with a light emitting element or a liquid crystal display device.

2. Description of the Related Art

Flat panel displays such as a liquid crystal panel have been improved so as to achieve higher definition images, lower power consumption, and longer life. To put into practical use an electroluminescent panel (hereinafter also referred to as an EL panel) using an electroluminescent element (hereinafter also referred to as an EL element) in a pixel, it is required to realize crisper and brighter display at lower power, utilizing the characteristics of a self light emitting panel. In order to achieve the objective, power efficiency such as current-luminance characteristics of a material used in an EL element has also been improved. However, there are also limitations on the improvements in power efficiency.

The percentage of light produced in a light emitting layer of an EL element that is obtained from a panel (light extraction efficiency) is only approximately 20%. The cause of such low light extraction efficiency is due to that when light produced in a light emitting layer reaches an interface between films having different refractive indices, the light is totally reflected, and the totally reflected light is attenuated while propagating inside the EL element, or the totally reflected light is emitted from a side surface of the light emitting element, for example, an end face of a glass substrate.

Reference 1 (Japanese Published Patent Application No. 2002-278477) discloses an EL element of which light extraction efficiency is increased by reducing the light quantity which is totally reflected. In Reference 1, a low refractive index layer having a refractive index close to that of the air is provided on a surface of a transparent conductive layer on the side from which light is obtained, thereby increasing light extraction efficiency.

SUMMARY OF THE INVENTION

However, in Reference 1, although the light quantity which is totally reflected between the transparent conductive layer and an air layer can be improved, there is a fear that the light quantity which is totally reflected may increase at the interface between the transparent conductive layer and the low refractive index layer. It is an object of the present invention to reduce the light quantity which is totally reflected after being transmitted through an electrode, thereby improving light extraction efficiency.

A light emitting element provided in a light emitting device of the present invention includes, for example, an organic EL element in which an organic material is used as a light emitting material, an inorganic EL element in which an inorganic material is used as a light emitting material, a light emitting diode using a semiconductor such as a compound semiconductor, or the like. A light emitting element of the invention is formed by sequentially stacking a first electrode, a light emitting layer, and a second electrode over a substrate. Light produced in the light emitting layer is emitted through a second electrode opposing the first electrode. The light emitting device includes at least one light emitting element. Alternatively, the light emitting device includes at least one light emitting region (a region where light can be taken out from the second electrode).

The first electrode is an electrode which can reflect light from the light emitting layer. Alternatively, the first electrode may be an electrode which can transmit light from the light emitting layer. The second electrode is an electrode which can transmit light from the light emitting layer.

At least one light emitting layer is provided between the first electrode and the second electrode. A plurality of light emitting layers may be provided between the electrodes. In the case where the light emitting element is an organic EL element, layers of an electron injection layer, an electron transporting layer, a hole blocking layer, a hole transporting layer, a hole injection layer, and the like may be provided in addition to the light emitting layer as appropriate. In the case of an inorganic EL element, an insulating layer may be provided between the light emitting layer and the first electrode and between the light emitting layer and the second electrode, or may be provided either between the light emitting layer and the first electrode or between the light emitting layer and the second electrode.

One or a plurality of bodies are selectively provided in contact with a surface of the second electrode where light is taken out. The refractive index of the body is not limited in particular; however, it may preferably be equal to or more than the refractive index of the light emitting layer.

"Selectively providing a body" means providing the body so that there is a region in the light emitting region where the body is not provided over the second electrode. In other words, the surface of the second electrode has a region which is covered with the body and a region which is not covered with the body. When the body is thus disposed, the body has a face which is not parallel to the interface between the second electrode and the body.

Light produced in the light emitting layer enters the second electrode directly or after reflected by the first electrode. Part of light which has reached the interface between the second electrode and the body can be transmitted through the second electrode without being totally reflected. Note that when the refractive index of the body is equal to or more than the refractive index of the light emitting layer, all of the light can enter the interface between the second electrode and the body without being totally reflected. This can be derived from Snell's law of geometrical optics and total reflection conditions.

In accordance with the present invention, the body is provided so as to have a face which is not parallel to the interface between the second electrode and the body, thereby taking out light incident on the body as much as possible. This is because even light incident on a top surface of the body at an incident angle with which the light is totally reflected can be taken outside when it is incident upon the face after totally reflected. That is, in the invention, light having entered the body is totally reflected inside the body, thereby the angle of incidence on the interface between the body and the air can be made smaller than the critical angle; thus, the light quantity taken out from the body increases. In the invention, the light quantity totally reflected on the top surface of the second electrode can be decreased by providing the body, and the incident light can be scattered in the body; thus, light can be efficiently taken out from the body. Therefore, the light extraction efficiency can be improved. As described above, in the invention, a projection is formed on a surface of an electrode where light is taken out so as to scatter light in a light emitting element, thereby taking the light out. The invention is especially suitable for use in a light emitting element having a top emission structure in which light is taken out upward. That is because, in the case of bottom emission, even when irregularities are formed on a surface of a glass, light transmitted through the glass can be taken out; however, light propagating inside the light emitting element cannot be taken out. However, in the case of top emission, all of the light propagates inside the light emitting element; thus, using the invention, probability of extracting light from a light emitting element can be increased.

In the present invention, a protective film may be provided on a surface of the second electrode, and at least one body can be selectively provided thereon. As the protective film, silicon oxide ($SiO_y$, $0<y\leq2$), silicon nitride ($SiN_x$, $0\leq x\leq4/3$), silicon nitride oxide ($SiN_xO_y$, $0<x<4/3$, $0<y<2$, $0<3x+2y\leq4$), or the like can be used.

A body of the present invention can be applied without limitation to a light emitting element of self-light emitting type and a light emitting device. For example, the invention can be applied to a transmissive or semi-transmissive liquid crystal display device. A body is provided on a surface of a pixel electrode of a liquid crystal display device, so that light transmitted through the pixel electrode can be taken out efficiently. In the case of a semi-transmissive liquid crystal display device, a body may be selectively provided in a region of a pixel electrode where light passes.

When at least one body is selectively provided over a second electrode, light extraction efficiency of light from the second electrode can be improved. When the light extraction efficiency is improved, a device with lower power consumption can be obtained.

BRIEF DESCRIPTION OF THE DRAWINGS

In the accompanying drawings:

FIGS. 7A and 7B show a structure of a light emitting device (Embodiment Mode 7);

DETAILED DESCRIPTION OF THE INVENTION

Embodiment Modes

Embodiment Modes and Embodiment of the present invention will be described below with reference to the drawings. The invention can be implemented in various forms. The forms can be changed without departing from the sprit and the scope of the invention. The invention should not be construed as being limited to the description of Embodiment Modes and Embodiment. Further, each of Embodiment Modes and Embodiment can be combined with each other as appropriate without departing from the sprit of the invention.

Embodiment Mode 1

This embodiment mode will be described with reference to FIG. 1A to FIG. 6C.

Figure 1A:
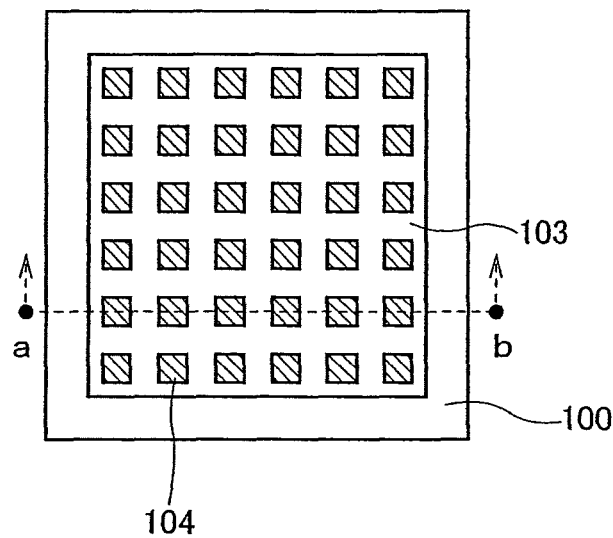
FIGS. 1A to 1C show a structure of a light emitting device (Embodiment Mode 1)
Figure 1B:
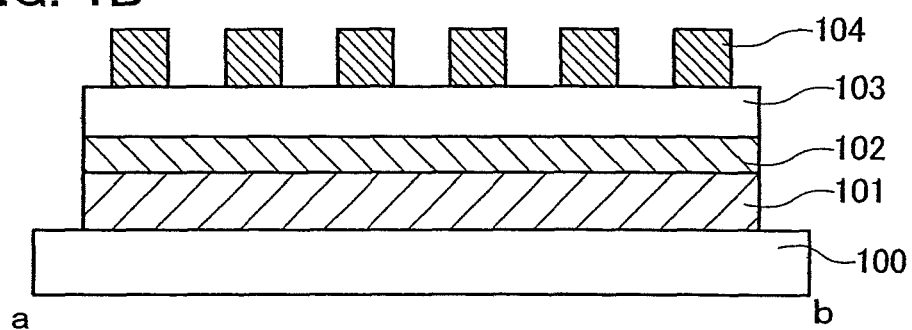
Figure 1C:
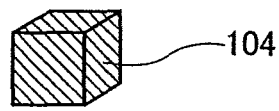

FIGS. 1A to 1C illustrate a light emitting device of this embodiment mode. FIG. 1A is a top view, FIG. 1B is a cross-sectional view taken along line a-b in FIG. 1A, and FIG. 1C is an external view of a body.

A light emitting element is provided over a substrate 100. In the light emitting element, a first electrode 101, a light emitting layer 102, and a second electrode 103 are sequentially stacked from the substrate 100 side. A plurality of bodies 104 are selectively provided in contact with a surface of the second electrode 103.

The substrate 100 serves as a support substrate of the light emitting element, for example, a quartz substrate, a semiconductor substrate, a glass substrate, a plastic substrate, a flexible plastic film, or the like can be used. Further, since light is not obtained from the substrate 100 side, the substrate need not be transparent, and may be colored or opaque.

The first electrode 101 has a function of reflecting light produced in the light emitting layer 102. The first electrode 101 is formed from a reflective conductive film of metal or an alloy. For the metal film, gold (Au), platinum (Pt), nickel (Ni), tungsten (W), chromium (Cr), molybdenum (Mo), iron (Fe), cobalt (Co), copper (Cu), palladium (Pd), aluminum (Al), or the like can be used. For the alloy film, an alloy of magnesium and silver, an alloy of aluminum and lithium, or the like can be used. Such a film constituting the first electrode 101 can be formed by sputtering, vapor deposition, or the like.

The light emitting layer 102 is formed over the first electrode 101 by vapor deposition or the like. The light emitting layer 102 is a layer containing a light emitting substance. A known material can be used for the light emitting layer 102, and a low molecular weight material or a high molecular weight material can also be used. Note that a material in which an organic compound material is mixed with an inorganic compound or a material containing only an inorganic compound material can also be used for the material of the light emitting layer 102 instead of a material containing only an organic compound material. Further, a method for manufacturing the light emitting layer 102 may be selected depending on the material of the light emitting layer 102 from, for example, vapor deposition using a metal mask, a droplet discharge method in which a metal mask is not used (generally, ink-jet printing), spin coating, and dip coating.

The second electrode 103 is formed over the light emitting layer 102. The second electrode 103 is an electrode which can transmit light produced in the light emitting layer 102. The light produced in the light emitting layer 102 is taken out from the second electrode 103 directly or after reflected by the first electrode 101.

The second electrode 103 is typically formed of a transparent conductive film. In particular, in the case where the light emitting element is an organic EL element, a conductive film in which a material which hardly transmit visible light, such as metal is provided very thinly with a thickness of 1 nm to 50 nm, preferably 5 nm to 20 nm approximately, on the first electrode 101 side and a transparent conductive film is stacked thereover can also be used in order to control the work function of the second electrode. In that case, gold (Au), platinum (Pt), nickel (Ni), tungsten (W), chromium (Cr), molybdenum (Mo), iron (Fe), cobalt (Co), copper (Cu), palladium (Pd), or the like can be used for the thin film formed extremely thinly. Such a thin film can be formed, for example, by sputtering, vapor deposition, or the like.

Note that the first electrode 101 can be formed as an electrode which can transmit light (transparent electrode) as well as the second electrode 103.

The typical material of the transparent conductive films used for the first electrode 101 and the second electrode 103 is metal oxide. For example, an oxide of one selected from zinc (Zn), indium (In), or tin (Sn), or a compound in which a dopant is added to such an oxide may be used. As a dopant for zinc oxide, Al, Ga, B, In, or the like may be used. Note that zinc oxides containing such dopants are called AZO, GZO, BZO, and IZO respectively. Further, Si can be used for a dopant of zinc oxide. As a dopant for indium oxide, Sn, Ti, or the like may be used. Indium oxide to which Sn is added is called ITO (Indium Tin Oxide). As a dopant for tin oxide, Sb, F, or the like may be used. In addition, a compound in which two kinds of oxides selected from the above zinc oxide, indium oxide, tin oxide, and such an oxide containing a dopant are mixed can be used for the transparent conductive film.

A light emitting element of the present invention is not limited to the structure shown in FIGS. 1A to 1C as long as at least one light emitting layer is provided between two electrodes. Light emitting elements using electroluminescence (EL) are classified into two types depending on whether a light emitting material contained in the light emitting layer is an organic compound or an inorganic compound, and generally, the former is called an organic EL element and the latter is called an inorganic EL element.

For example, in the case where the light emitting element is an organic EL element, functional layers such as an electron injection layer, an electron transporting layer, a hole blocking layer, a hole transporting layer, and a hole injection layer may be combined freely in addition to the light emitting layer. Further, a plurality of light emitting layers may be provided between the electrodes.

Further, the light emitting element may be formed as an inorganic EL element. The inorganic EL element is classified into one of a dispersed inorganic EL element and a thin film inorganic EL element depending on the element structure. They are different in that the former has a light emitting layer in which particles of the light emitting material are dispersed in a binder, and the latter has a light emitting layer formed of a thin film made of a light emitting material; however, a common point is that they both require electrons accelerated at high electric field. As the mechanism of light emission to be achieved, there are two types: donor-acceptor recombination emission in which a donor level and an acceptor level are used, and local emission in which inner shell electron transition in a metal ion is used. Generally, donor-acceptor recombination emission is typically used for a dispersed inorganic EL element and local emission is typically used for a thin film inorganic EL element.

A plurality of bodies 104 are selectively provided in contact with the surface of the second electrode 103. In FIGS. 1A to 1C, the bodies 104 each have a three-dimensional shape of a columnar having a rectangular base. A material for the bodies 104 is selected from materials which easily transmit light produced in the light emitting layer 102. Further, the refractive index of the bodies 104 is preferably equal to or more than that of the light emitting layer 102. When the refractive index is thus adjusted, light incident on the interface between the second electrode 103 and the bodies 104 is not totally reflected by the interface, and can enter inside the bodies 104; thus, light extraction efficiency can be further improved.

Since the bodies 104 each have a face which is not parallel to the interface between the bodies and the second electrode 103, even when light enters the bodies 104 at an incidence angle which causes total reflection at the top surface of the bodies 104, the light can be taken out from the face of the bodies 104. Accordingly, the light quantity which can be taken out from the second electrode 103 can be increased.

Each of the bodies 104 can have a height in the range from 50 nm to 100 µm. Further, any length of one side of the base is acceptable as long as the length is in the range such that the bodies 104 can be selectively provided with respect to the second electrode 103. Accordingly, each base of the bodies 104 may have a side length in the range from 50 nm to 100 µm.

The shape of the base of the columnar bodies 104 is not limited to a rectangular shape, and may be a polygonal shape such as a triangular, rectangular, or pentagonal shape.

Figure 2A:
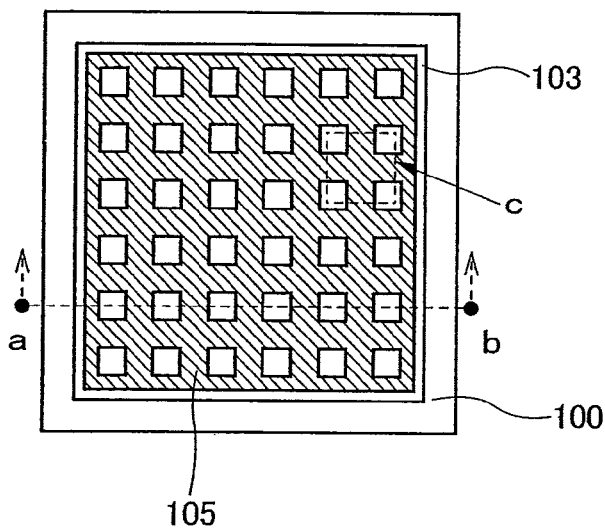
FIGS. 2A to 2C show a structure of a light emitting device (Embodiment Mode 2)
Figure 2B:
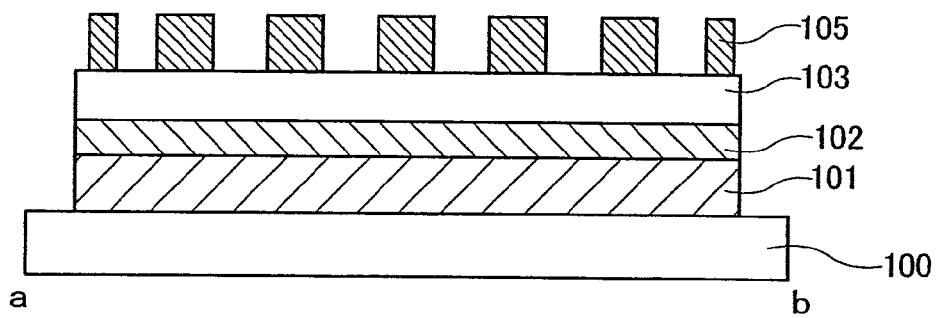
Figure 2C:
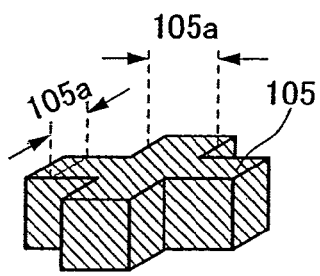

A plurality of bodies 104 are provided in FIGS. 1A to 1C; alternatively, one body 105 may be selectively provided over the second electrode 103 as shown in FIGS. 2A to 2C. FIG. 2A is a top view, FIG. 2B is a cross-sectional view taken along line a-b in FIG. 2A, and FIG. 2C is an external view of a body cut in a rectangular shape of a region C in FIG. 2A.

The body 105 has a three-dimensional shape of a rectangular solid having a plurality of openings. There is a relationship between the body 105 and the bodies 104 in which the body 105 exists in the region where the bodies 104 do not exist and the body 105 does not exist in the region where the bodies 104 exist in FIGS. 1A to 1C. The openings each have a columnar shape as the bodies 104 have. The shape of the openings in the body 105 (the shape of a base of each opening) is not limited to a rectangular shape, and may be a polygonal shape such as a triangular, rectangular, or pentagonal shape.

The height of the body 105 can be in the range from 50 nm to 100 µm. Further, any width 105a of the body 105 may be acceptable as long as in a range such that the body 105 can be selectively provided with respect to the second electrode 103. Accordingly, the width 105a of the body 105 can be in the range from 50 nm to 100 µm.

Figure 3:
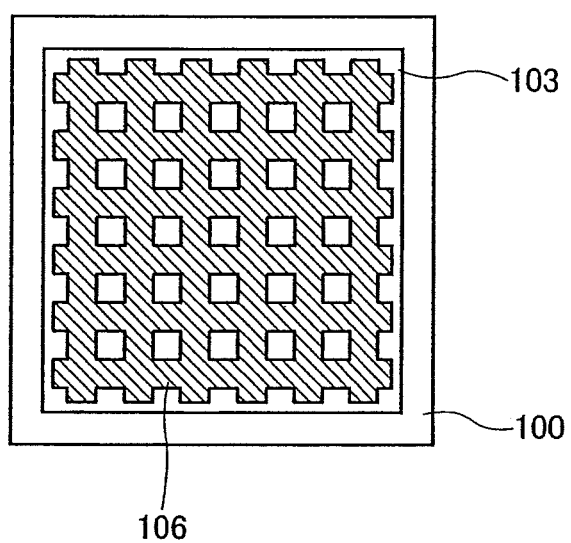
FIG. 3 shows a structure of a light emitting device (Embodiment Mode 3)

Further, as shown in FIG. 3, a body 106 in which prisms are assembled to form a shape of parallel crosses can be provided. The size of the body 106 can be determined in the similar manner as the body 105.

Figure 4A:
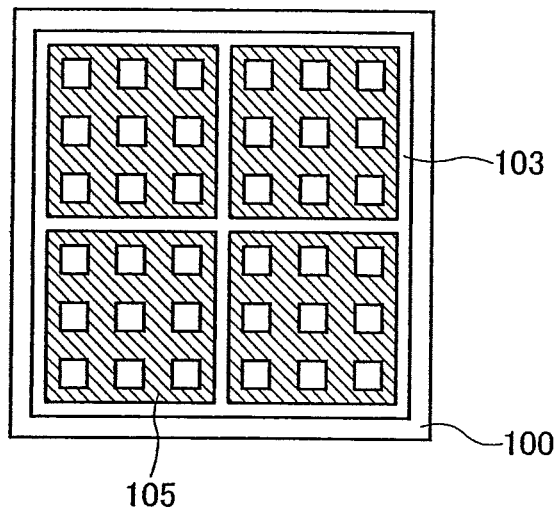
FIGS. 4A and 4B each show a structure of a light emitting device (Embodiment Mode 4)
Figure 4B:
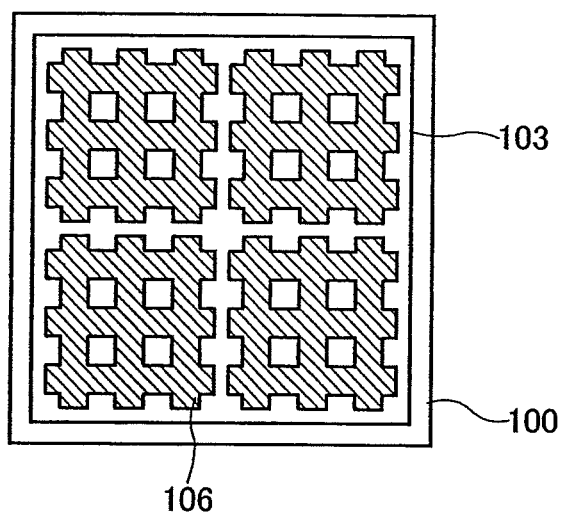

Further, a plurality of bodies 105 or a plurality of bodies 106 can be provided over one second electrode 103 as shown in FIGS. 4A and 4B, respectively.

A protective film may be provided on a surface of the second electrode 103, and bodies can be provided on the surface of the protective film. As the protective film, silicon oxide ($SiO_y$, $0<y\leq 2$), silicon nitride ($SiN_x$, $0<x\leq 4/3$), silicon nitride oxide ($SiN_xO_y$, $0<x<4/3$, $0<y<2$, $0<3x+2y\leq 4$), or the like can be used. The thickness of the protective film may be 0.1 µm or more in the range from 0.1 µm to 10 µm.

As will be described later in Embodiment Mode 2, the light emitting element is sealed by securing a sealing substrate to an element substrate provided with the element. Space between the element substrate and the sealing substrate is filled with a sealing material formed of gas or resin. In the case of filling with resin, a resin in a liquid phase state is used for filling and is hardened; however, there is a fear that when the resin is hardened, films constituting the light emitting element are stressed, which affects the characteristics of the light emitting element. If the thickness of the protective film is 1 μm or more, such an effect can be eliminated, which is preferable.

The body can be formed by an imprinting technique or a nanoimprinting technique with which a nanoscale three-dimensional structure can be formed by a transfer technology. Imprinting and nanoimprinting are techniques with which a minute three-dimensional structure can be formed without using a photolithography process.

In the present invention, it is also an object to provide an imprinting technique or a nanoimprinting technique suitable for manufacturing such a minute three-dimensional structure as the body. With reference to FIGS. 5A to 5D, a manner of forming the body by an imprinting technique (including a nanoimprinting technique here) will be described.

Figure 5A:
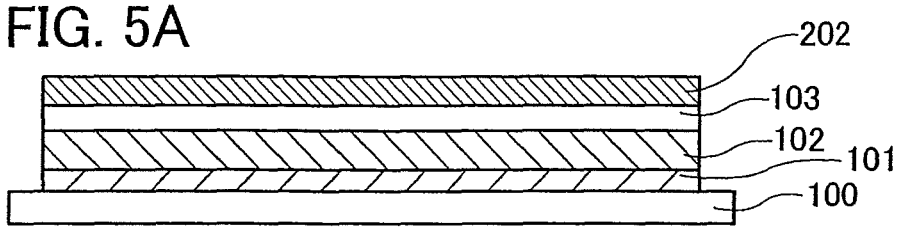
FIGS. 5A to 5D illustrate a method of manufacturing a light emitting device (Embodiment Mode 5)

A substrate 100 provided with the first electrode 101, the light emitting layer 102, the second electrode 103 is prepared. A resin material 202 is provided on a surface of the second electrode 103 by a method such as spin coating, screen-printing, or a dispensing method to form the body. Here, a thermosetting resin material is used as the resin material 202. Alternatively, an ultraviolet curable resin or a thermoplastic resin may be used. A process of hardening may be changed in accordance with the properties of the resin (FIG. 5A).

Figure 5B:
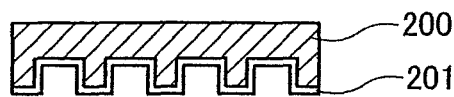

A stamper 200 having a three-dimensional structure with irregularities corresponding to the body is prepared. The stamper 200 is formed of quartz. Titanium oxide 201 is formed on the surface of the irregularities of the stamper 200. The titanium oxide 201 is a feature. The details will be described later (FIG. 5B).

Figure 5C:
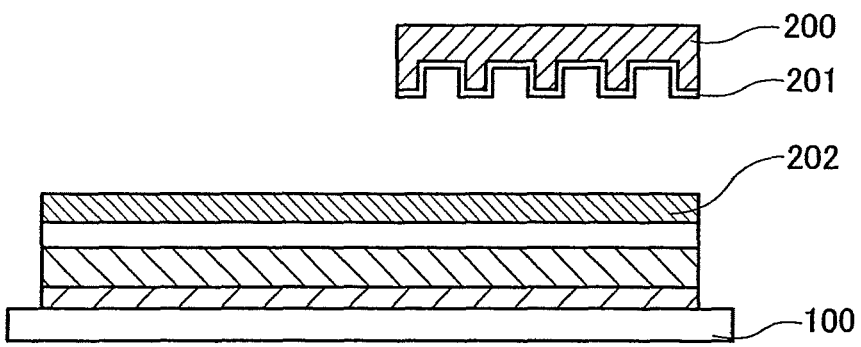

The stamper 200 can be moved up and down using a lifting and lowering mechanism of an imprinting device. The substrate 100 is set on the press of the imprinting device (FIG. 5C).

Figure 5D:
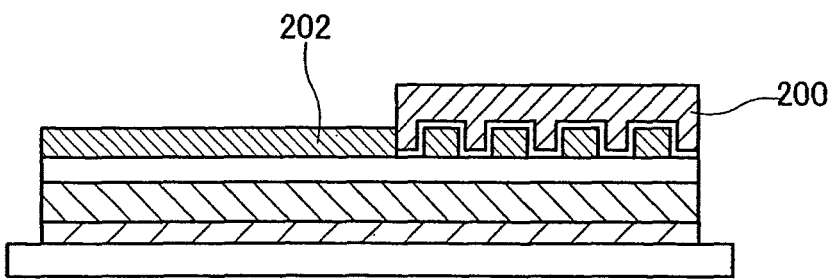

After heating to a predetermined temperature, the stamper 200 is lowered with the lifting and lowering mechanism to contact the resin material 202. The irregular surface of the stamper 200 is pressed onto the resin material 202 by applying pressure using the press, thus transferring the irregular shape of the surface of the stamper 200 to the resin material 202 (FIG. 5D).

Figure 6A:
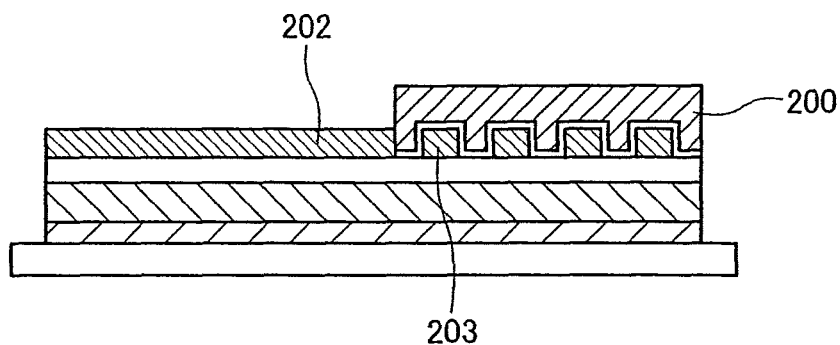
FIGS. 6A to 6C illustrate a method of manufacturing a light emitting device (Embodiment Mode 6)

In a state where the stamper 200 is pressed, the stamper 200 is heated to harden an area of the resin material 202, which is deformed by the stamper 200, thereby forming a body 203. Here, the substrate 100 is also heated (FIG. 6A).

After the stamper 200 and the substrate 100 are cooled to room temperature, the application of pressure using the press is stopped, and the stamper 200 is lifted; thus, the body 203 is separated from the stamper 200.

Thus, in the imprinting technique, heating and cooling are performed while the resin material is pressed onto the stamper. The coefficients of thermal expansion of the stamper and the resin material differ from each other; therefore, the shrinkage of the resin material is different from that of the stamper when cooling them. Accordingly, the hardened resin material is embedded in a depressed portion in the surface of the stamper, so that the resin material may not be separated from the stamper easily. In such a situation, there is a fear that when the stamper is lifted, the hardened resin material may be deformed or the resin material may be separated from the second electrode 103.

Figure 6B:
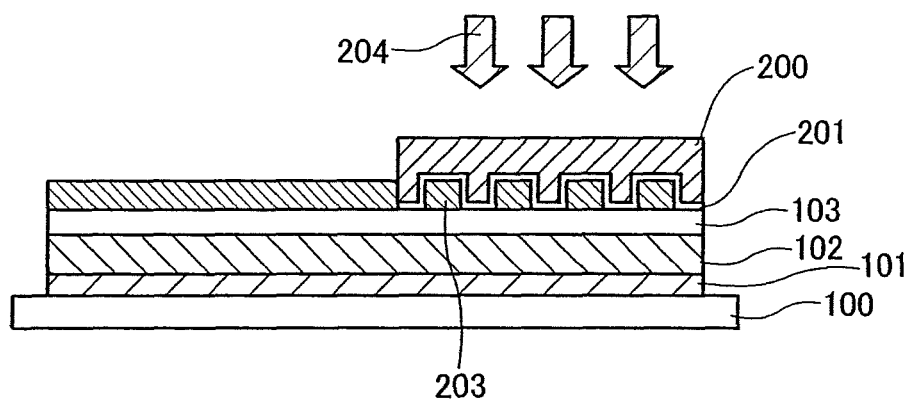

In order to resolve such troubles, the stamper 200 covered with the titanium oxide 201 is used. Before lifting the stamper 200, UV light 204 is delivered to the titanium oxide 201 through the stamper 200 (FIG. 6B).

The titanium oxide is activated by the UV light 204 to effect catalytic action, thereby the adhesion of the titanium oxide 201 with the body 203 (the hardened resin material 202) is decreased. Accordingly, when the stamper 200 is lifted, the stamper 200 can be separated from the body 203 without deforming the body 203.

Figure 6C:
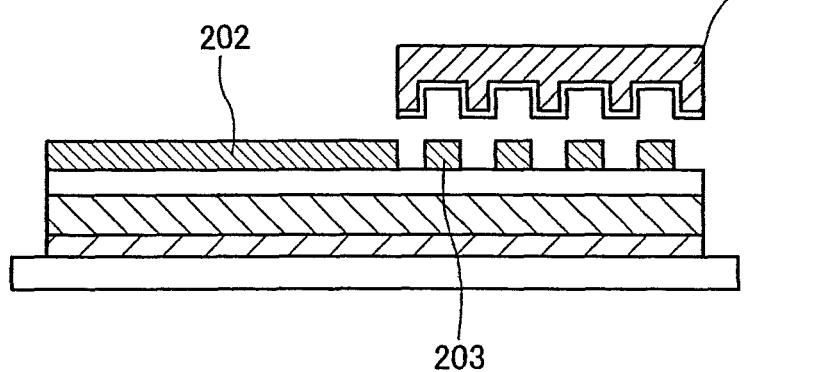

After irradiation with the UV light 204, the stamper 200 is lifted to separate the stamper 200 from the body 203 (FIG. 6C).

Steps shown in FIG. 5D and thereafter are repeated while moving the substrate 100 relative to the stamper 200; thus, a body 203 is formed at a desired position on the second electrode 103.

Such an imprinting technique using a stamper whose surface is provided with titanium oxide can be applied not only to the formation of a body in the present invention but also to general processes of forming a three-dimensional structure which have been performed using conventional imprinting techniques. For example, the technique can be applied to the formation of patterns in a data storage medium or to the formation of patterns of electrical components.

Embodiment Mode 2

In this embodiment mode, an active matrix light emitting device in which driving of a light emitting element is controlled by a transistor will be described.

In this embodiment mode, a light emitting device including a pixel portion which has a light emitting element manufactured utilizing the present invention will be described with reference to FIGS. 7A and 7B. FIG. 7A is a top view showing the light emitting device and FIG. 7B is a cross-sectional view taken along lines A-A' and B-B' in FIG. 7A. Reference numeral 601 denotes a driver circuit area (a source driver circuit); 602, a pixel portion; 603, a driver circuit area (a gate driver circuit); which are indicated by dashed lines. Reference numeral 604 denotes a sealing substrate and 605 denotes a sealing material. Reference numeral 607 denotes a space surrounded by the sealing material 605.

Note that a lead wiring 608 is a wiring for transmitting signals to be inputted to the source driver circuit 601 or the gate driver circuit 603. The lead wiring 608 receives a video signal, a clock signal, a start signal, a reset signal, and the like from an FPC (flexible printed circuit) 609 which serves as an external input terminal. Although only the FPC is shown here, this FPC may be provided with a printed wiring board (PWB). A light emitting device in this specification refers not only to a main body of a light emitting device, but also a light emitting device provided with an FPC or a PWB.

A cross-sectional structure will be described with reference to FIG. 7B. The driver circuit areas and the pixel portion are formed over an element substrate 610. Here, the source driver circuit 601 which is the driver circuit area and one pixel in the pixel portion 602 are shown.

Note that as the source driver circuit 601, a CMOS circuit in which an n-channel thin film transistor (hereinafter referred to as TFT) 623 and a p-channel TFT 624 are combined is formed. A driver circuit may be formed using a known CMOS circuit, PMOS circuit, or NMOS circuit. Although a driver integrated type in which a driver circuit and a pixel portion is formed over a substrate is described in this embodiment mode, it is not necessarily be used. The driver circuit can be formed not over the substrate, but apart from the substrate. Note that the structure of the TFT is not particularly limited. Either a staggered TFT or an inverted staggered TFT may be used. Further, the crystallinity of a semiconductor film used in the TFT is not particularly limited. Either an amorphous semiconductor film or a crystalline semiconductor film may be used. In addition, the semiconductor material is not limited, and either an inorganic compound or an organic compound may be used.

The pixel portion 602 includes a plurality of pixels each having a switching TFT 611, a current control TFT 612, and a first electrode 613 electrically connected to a drain of the current control TFT 612. Note that an insulator 614 is formed to cover an edge portion of the first electrode 613. Here, the insulator 614 is formed using a positive photosensitive acrylic resin film.

The insulator 614 is formed to have a curved surface at an upper end or a lower end thereby achieving good coverage. When positive photosensitive acrylic is used as a material of the insulator 614, the insulator 614 is preferably formed to have a curved surface with a curvature radius (0.2 to 3 μm) only at an upper end. Either a negative type which becomes insoluble in an etchant by light irradiation or a positive type which becomes soluble in an etchant by light irradiation can be used as the insulator 614.

Over the first electrode 613, a light emitting layer 616 and a second electrode 617 are formed. At least the second electrode 617 of the first electrode 613 and the second electrode 617 transmits light, so that light from the light emitting layer 616 can be taken outside.

A body 600 which has been described in Embodiment Mode 1 is provided over the second electrode 617. The body is provided entirely over the second electrode 617 in FIGS. 7A and 7B. Alternatively, for example, the body may be provided only in a light emitting region of the second electrode 617 (a region included in a light emitting element 618).

Various methods can be used for forming the first electrode 613, the light emitting layer 616, and the second electrode 617. In specific, a physical vapor deposition (PVD) method, for example, a vacuum vapor deposition method such as a resistance heating vapor deposition method or an electron beam vapor deposition (EB vapor deposition) method, or a sputtering method; a chemical vapor deposition (CVD) method, for example, a metal organic CVD method or a low-pressure hydride transport CVD method; or an atomic layer epitaxy (ALE) method; or the like can be used. Alternatively, an ink jet method, a spin coating method, or the like can be used. In addition, each electrode and layer may be formed by a film formation method different from the others.

The sealing substrate 604 and the element substrate 610 are attached to each other with the sealing material 605, thereby making a structure in which the light emitting element 618 is located in the space 607 surrounded by the element substrate 610, the sealing substrate 604, and the sealing material 605. Note that the space 607 is filled with filler. There may be a case where the space 607 is filled with the sealing material formed of resin, as well as a case where the space 607 is filled with an inert gas (such as nitrogen or argon).

Note that an epoxy-based resin is preferably used as the sealing material 605. The material desirably allows as little moisture and oxygen as possible to penetrate. As the sealing substrate 604, a plastic substrate formed of FRP (Fiberglass-Reinforced Plastics), PVF (polyvinyl fluoride), polyester, acrylic, or the like can be used, as well as a glass substrate or a quartz substrate.

Embodiment Mode 3

Figure 8:
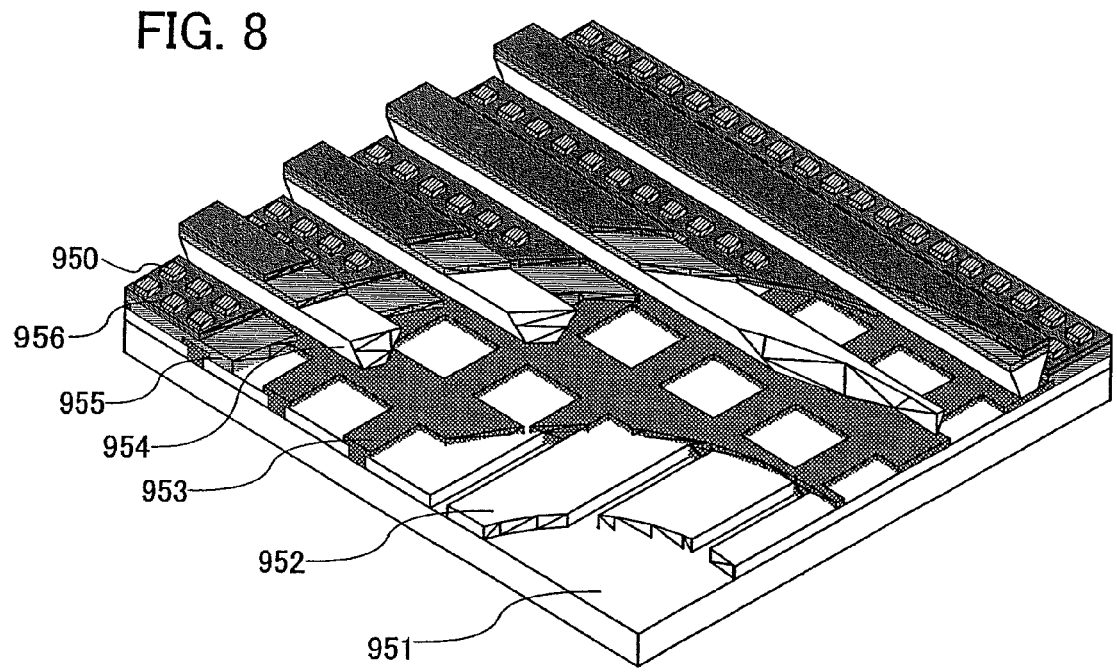
FIG. 8 shows a structure of a light emitting device (Embodiment Mode 8)

FIG. 8 shows a perspective view of a passive matrix light emitting device manufactured utilizing the present invention.

In FIG. 8, a first electrode 952, a second electrode 956, and a light emitting layer 955 therebetween are provided over a substrate 951. The second electrode 956 is a light-transmitting electrode. The first electrode 952 may be either a reflective electrode or a light-transmitting electrode. The first electrode 952 and the second electrode 956 are striped electrodes, which are provided so as to intersect at right angles. A region where the first electrode 952 and the second electrode 956 intersect is the light emitting region (light emitting element). A body 950 shaped like a rectangular solid is provided over the second electrode 956, thus improving light extraction efficiency. The body 950 may naturally have another shape.

An edge portion of the first electrode 952 is covered with an insulating layer 953. A partition layer 954 is provided over the insulating layer 953. The side walls of the partition layer 954 are sloped so that the distance between one side wall and the other side wall becomes narrower toward a substrate surface. In other words, a cross section of the partition layer 954 in the direction of a narrow side is trapezoidal, and the base (a side facing the same direction as a plane direction of the insulating layer 953 and is in contact with the insulating layer 953) is shorter than the upper side (a side facing the same direction as the plane direction of the insulating layer 953 and is not in contact with the insulating layer 953). By providing the partition layer 945 in such a manner, a defect of the light emitting element due to static electricity or the like can be prevented.

A sealing substrate is secured with a sealing material in the passive matrix light emitting device in FIG. 8, as well as the active matrix light emitting device in FIG. 7A and 7B.

Embodiment Mode 4

A light emitting device of the present invention can be used as a display portion of an electronic device. In this embodiment mode, electronic devices using such light emitting devices will be described. Each electronic device described in this embodiment mode has a light emitting element shown in Embodiment Mode 1, 2, or 3. Therefore, electronic devices with lower power consumption can be provided.

As the electronic devices which are manufactured utilizing the present invention, a video camera, a digital camera, a goggle type display, a navigation system, an audio reproducing device (car audio, audio components, or the like), a computer, a game machine, a portable information terminal (a mobile computer, a mobile phone, a portable game machine, an electronic book, or the like), an image reproducing device provided with a recording medium (specifically, a device which reproduces the content of a recording medium such as a digital versatile disc (DVD) and which is provided with a display device for displaying reproduced images), and the like can be given. Specific examples of these electronic devices are shown in FIGS. 9A to 9D.

Figure 9A:
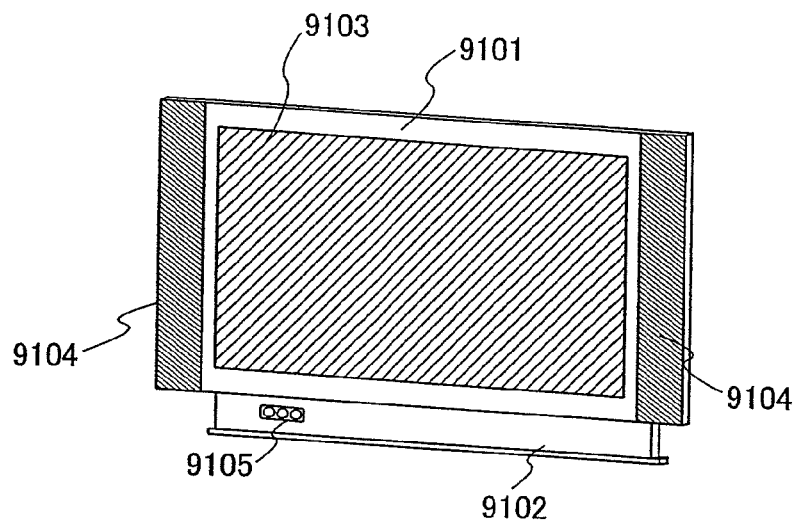
FIGS. 9A to 9D each show a mode of an electronic device using the present invention (Embodiment Mode 9)

FIG. 9A shows a television apparatus utilizing the present invention, which includes a chassis 9101, a support 9102, a display portion 9103, a speaker portion 9104, a video input terminal 9105, and the like. In the television apparatus, the display portion 9103 has light emitting elements similar to those described in Embodiment Mode 1, 2, or 3, which are arranged in matrix. By improving light extraction efficiency of the light emitting element, the power consumption of the television apparatus can be reduced accordingly. Thus, the television can be made suitable for living environments.

Figure 9B:
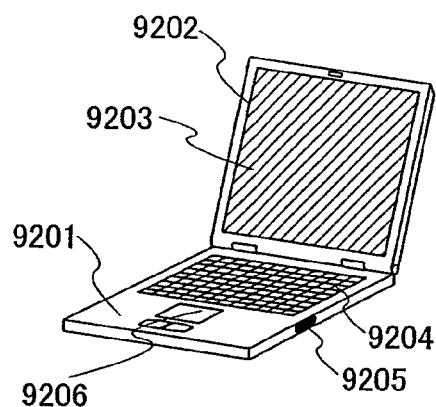

FIG. 9B shows a computer utilizing the present invention, which includes a main body 9201, a chassis 9202, a display portion 9203, a keyboard 9204, an external connection port 9205, a pointing mouse 9206, and the like. In the computer, the display portion 9203 has light emitting elements, which are arranged in matrix. By improving light extraction efficiency of the light emitting element, the power consumption of the computer can be reduced accordingly.

Figure 9C:
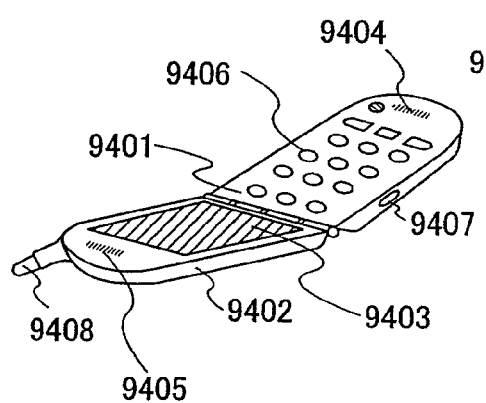

FIG. 9C shows a mobile phone, which includes a main body 9401, a chassis 9402, a display portion 9403, an audio input portion 9404, an audio output portion 9405, an operation key 9406, an external connection port 9407, an antenna 9408, and the like. In the mobile phone, the display portion 9403 has light emitting elements, which are arranged in matrix. Since light extraction efficiency of the light emitting elements has been improved, the power consumption of the mobile phone can be reduced. Further, the convenience can be enhanced.

Figure 9D:
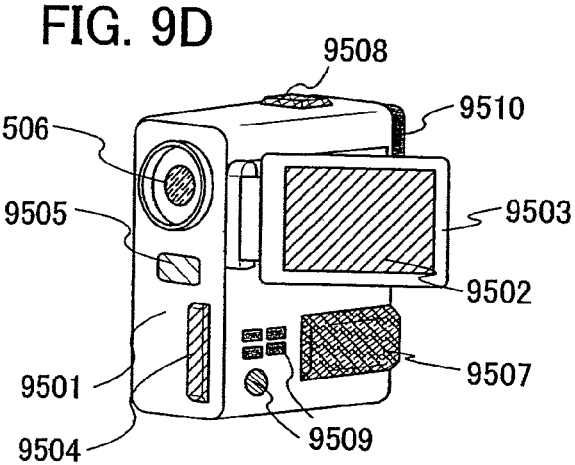

FIG. 9D shows a video camera as a camera. This video camera includes a main body 9501, a display portion 9502, a chassis 9503, an external connection port 9504, a remote control receiving portion 9505, an image receiving portion 9506, a battery 9507, an audio input portion 9508, an operation key 9509, an eye piece portion 9510, and the like. In this video camera, the display portion 9502 has light emitting elements, which are arranged in matrix. Since light extraction efficiency of the light emitting elements has been improved, the power consumption of the video camera can be reduced accordingly. Thus, video cameras that are more convenient can be obtained.

As described above, a light emitting device of the present invention can be widely applied and used for electronic devices in various fields. By applying the present invention, an electronic device with low power consumption can be manufactured.

Embodiment Mode 5

A light emitting device of the present invention can be used as a lighting device. A mode of using a light emitting element to which the present invention is applied as a lighting device will be described with reference to FIG. 10.

Figure 10:
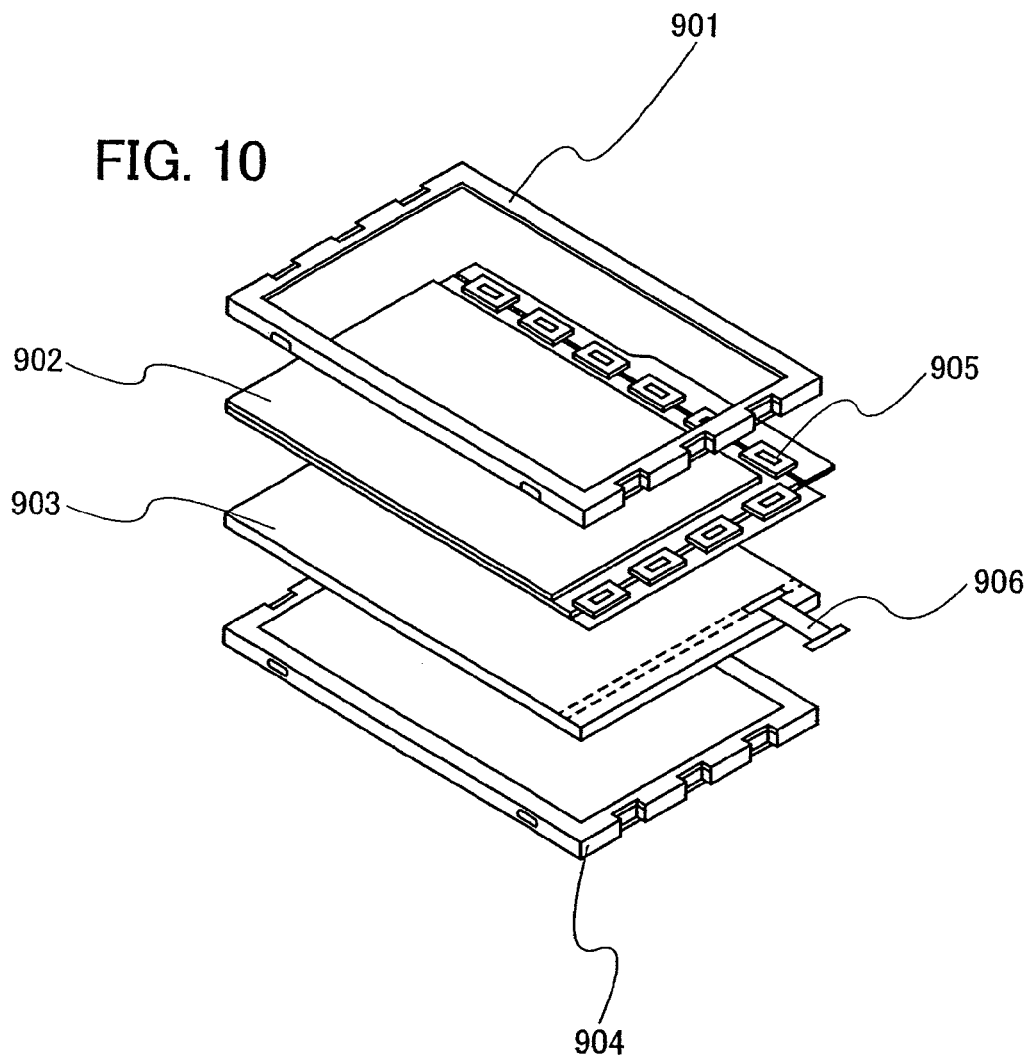
FIG. 10 shows a mode of a liquid crystal display device to which the present invention is applied (Embodiment Mode 10)

FIG. 10 shows an example of a liquid crystal display device using a light emitting device to which the present invention is applied, as a backlight. A liquid crystal display device shown in FIG. 10 includes a chassis 901, a liquid crystal layer 902, a back light 903, and a chassis 904. The liquid crystal layer 902 is connected to a driver IC 905. In addition, a light emitting device of the present invention is used for the back light 903 and current is supplied thereto through a terminal 906.

By using a light emitting device to which the present invention is applied as a backlight of a liquid crystal display device, a bright backlight with lower power consumption can be obtained. In addition, a light emitting device to which the present invention is applied is a lighting device which performs surface light emission, and the area of which can be enlarged; therefore, the area of the backlight can be increased and the screen of a liquid crystal display device can be also enlarged. Further, since the light emitting device is thin and consumes less power, the display device can also have smaller thickness and lower power consumption can be achieved.

A light emitting device of the invention can also be used as a planar lighting device other than a backlight of a liquid crystal display device.

Embodiment 1

Figure 11A:
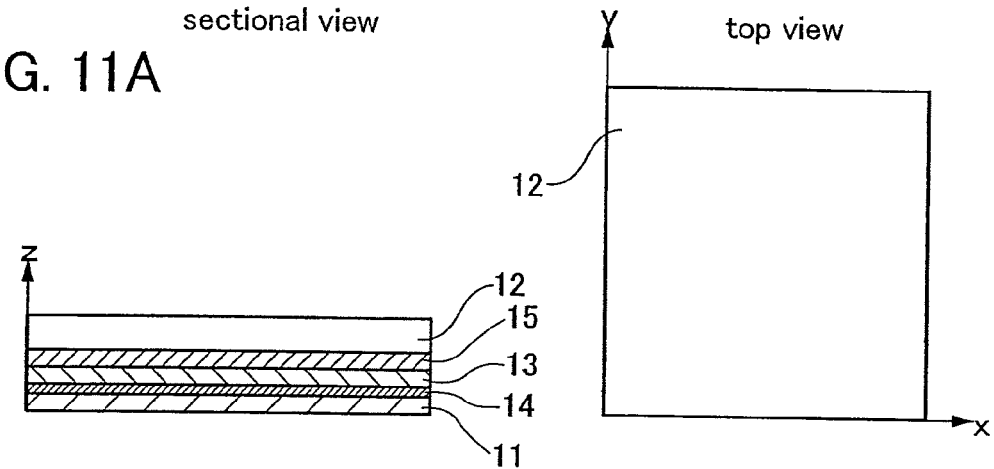
FIGS. 11A to 11C each show a structure of a light emitting element used for calculation (Embodiment 1)
Figure 11B:
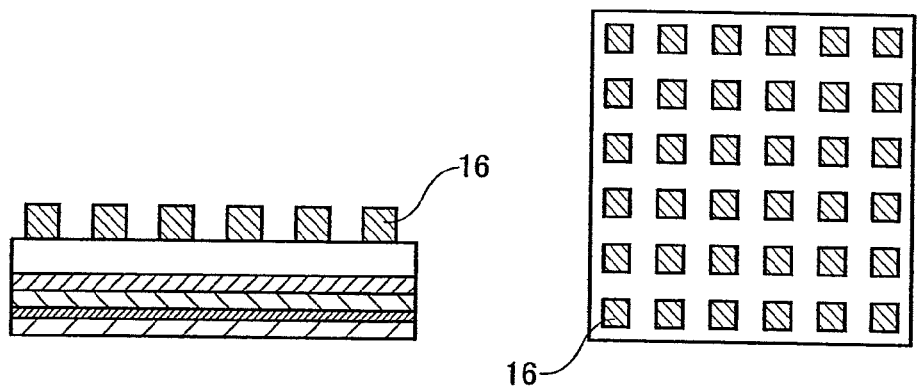
Figure 11C:
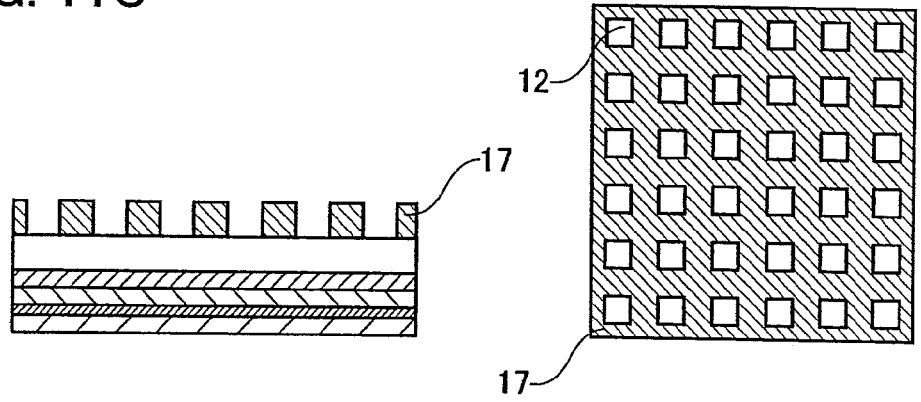

The effect of improvement in light extraction efficiency with the use of a body is verified by calculation. An organic EL element was assumed as a light emitting element. The light extraction efficiencies of three light emitting elements A to C were obtained by calculation. FIG. 11A to FIG. 11C show cross-sectional views and top views of the light emitting elements A to C, respectively.

The light emitting element A shown in FIG. 11A is an element which is not provided with a body. The light emitting element A is provided with a first electrode 11, a second electrode 12, and a light emitting layer 13 therebetween. An electron transporting layer 14 is provided between the first electrode 11 and the light emitting layer 13, and a hole transporting layer 15 is provided between the second electrode 12 and the light emitting layer 13.

The first electrode 11 is formed of aluminum, the second electrode 12 is formed of ITO, and the light emitting layer 13 is a film formed by codeposition of tris (8-quinolinolato) aluminum (abbreviated to $Alq_3$) and coumarin 6 (here, referred to as C6). The electron transporting layer 14 is formed of 4,4'-bis[N-(1-naphthyl)-N-phenylamino]-biphenyl (abbreviated to α-NPD), and the hole transporting layer 15 is formed of $Alq_3$.

Table 1 shows a structure of the light emitting element A, film thicknesses used for calculation, and refractive indices (real parts and imaginary parts). The refractive indices are values measured with respect to a wavelength of 500 nm in the manufactured light emitting element A.

TABLE 1

| structure | material | Film thickness (nm) | Refractive index (real part) | Refractive index (imaginary part) |
|---|---|---|---|---|
| second electrode 12 | ITO | 100 | 2.1475 | 0.059216 |
| hole transporting layer 15 | $Alq_3$ | 50 | 1.728378936 | 0 |
| light emitting layer 13 | $Alq_3$ + C6 | 50 | 1.728378936 | 0 |
| electron transporting layer 14 | α-NPD | 30 | 1.828693223 | 0 |
| first electrode 11 | Al | 50 | 0.62108 | 5.4852 |

The light emitting element B shown in FIG. 11B has the same structure as the light emitting element A except for that bodies 16 are provided. The bodies 16 are cubes each having a side of 0.1 μm, and they are arranged in x and y directions with a spacing of 0.1 μm.

The light emitting element C shown in FIG. 11C has the same structure as the light emitting element A except for that bodies 17 are provided. The body 17 and the bodies 16 have a relationship where the body 17 exists in the regions where the bodies 16 do not exist and the body 17 does not exist in the region where the bodies 16 exist. The body 17 is a rectangular solid having a height of 0.1 μm, in which cubic openings each having a side of 0.1 μm are arranged in x and y directions with a spacing of 0.1 μm.

The light quantities taken out from the above light emitting elements A to C were calculated. A manner of resolving Maxwell's equations using a Finite-Difference-Time-Domain method (FDTD method) was used for calculation. Full-WAVE sold by RSoft Design Group Japan KK was used for the calculation.

Figure 12:
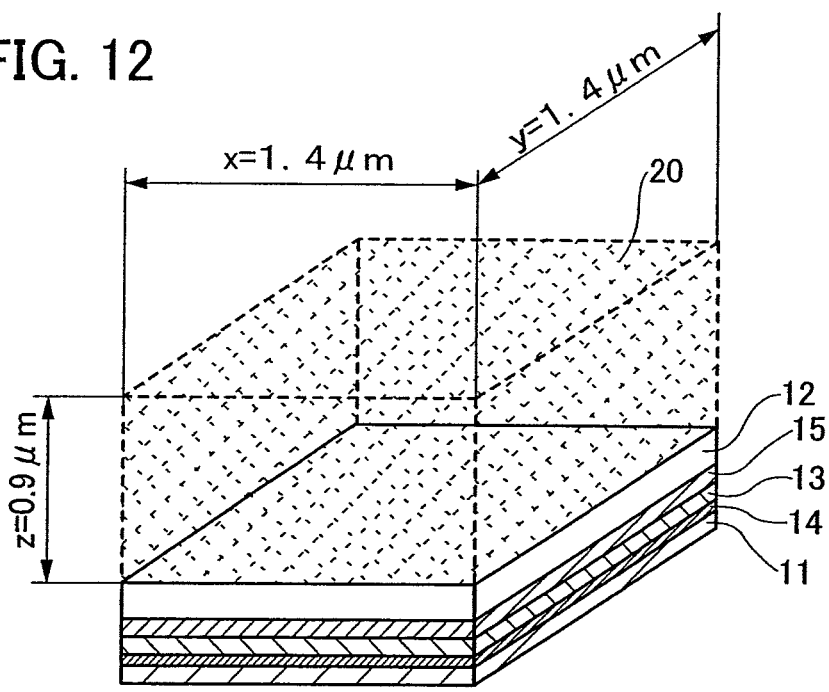
FIG. 12 is a diagram showing a region where the light quantity is calculated (Embodiment 1)

As shown in FIG. 11A, directions along x, y, and z axes were assumed. As shown in FIG. 12, the light quantity entering the side surfaces and the top surface of a rectangular solid 20 which are shown by dotted lines was calculated. The rectangular solid measures 1.4 μm (x)×1.4 μm (y)×0.9 μm (z). Absorbing boundary conditions are used as boundary conditions.

Light sources were assumed to emit light having a single wavelength of 500 nm. The positions of light sources were plotted using x, y, and z coordinates. The z coordinates were fixed at a position of 10 nm above the interface between the hole transporting layer 15 and the light emitting layer 13, and x and y coordinates were varied. The x and y coordinates were each sectioned at 20 nm intervals in the range from −100 to 100 nm. Further, calculations were performed as many times as the number of light sources which are provided on the points plotted using the x and y coordinates. Further, the light quantity passing through the side surfaces and the top surface of the rectangular solid 20 was summed to obtain the light quantity which is obtained from the light emitting element.

At that time, the spatial grid size (x, y, z) was given as 10 nm and the temporal grid size was given as $1.92466 \times 10^{-18}$ seconds. In reality, the light quantity is calculated using 5.77 nm as the temporal grid size, which is the distance light travels through a medium having a refractive index of 1 during the period.

Further, the bodies 16 of the light emitting element B and the body 17 of the light emitting element C have refractive indices each containing a real part of 2 and an imaginary part of 0, which are higher than the refractive index of the light emitting layer 13.

Figure 13:
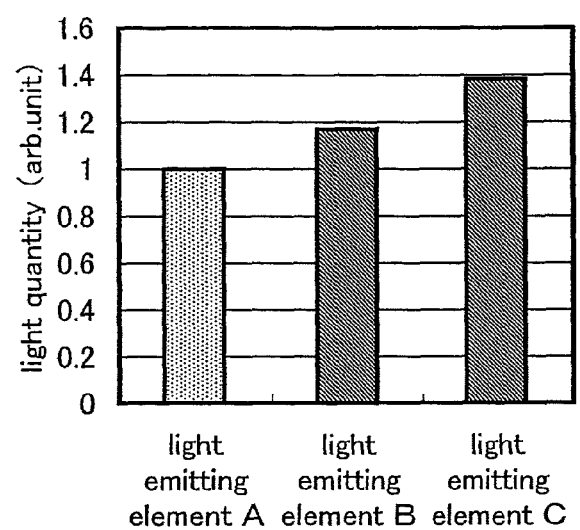
FIG. 13 is a graph showing the light quantity which can be emitted from a light emitting element, obtained from calculation (Embodiment 1).

The light quantities taken out from the light emitting elements A to C were calculated under the above conditions. FIG. 13 shows the calculated result. In a graph of FIG. 13, the light quantities of the light emitting elements B and C are shown where the light quantity of the light emitting element A was set at 1.0 as reference. In the calculated result, the light quantity of the light emitting element B was 1.17 and the light quantity of the light emitting element C was 1.38. Thus, it was proved by calculation that the light quantity taken out from a light emitting element can be increased by providing a body.

The reason the light extraction efficiency of the light emitting element C was higher than that of the light emitting element B is considered as follows. In the present invention, the amount of total reflection can be reduced at a region provided with a body. The light emitting element C has larger area of a region where the body is in contact with the second electrode, which is considered to lead to higher light extraction efficiency.

This application is based on Japanese Patent Application Serial No. 2006-058753 filed in Japan Patent Office on Mar. 3, 2006, the entire contents of which are hereby incorporated by reference.

What is claimed is:

1. A method for manufacturing a light-emitting device, the method comprising:
    forming a first electrode;
    forming a light-emitting layer over the first electrode;
    forming a second electrode over the light-emitting layer;
    forming a resin layer over the second electrode so as to allow the resin layer to be in
    direct contact with the second electrode;
    bringing a stamper having a convex-concave surface into contact with the resin layer so that a surface shape of the stamper is transferred to the resin layer;
    wherein the convex-concave surface is covered by titanium oxide;
    curing the resin layer;
    irradiating the stamper with light after the resin layer is cured while maintaining the direct contact with the stamper and the cured resin layer such that the adhesion of the titanium oxide to the resin layer is decreased; and
    separating the stamper from the resin layer.

2. The method according to claim 1,
    wherein the second electrode is a transparent electrode.

3. The method according to claim 1,
    wherein the resin layer comprises a thermosetting resin.

4. A method for manufacturing a light-emitting device, the method comprising:
    forming a first electrode;
    forming a light-emitting layer over the first electrode;
    forming a second electrode over the light-emitting layer;
    forming a resin layer over the second electrode so as to allow the resin layer to be in direct contact with the second electrode;
    bringing a stamper having a convex-concave surface into contact with the resin layer so that a top surface of a convex of the stamper is brought into direct contact with the second electrode;
    wherein the convex-concave surface is covered by titanium oxide;
    curing the resin layer;
    irradiating the stamper with light after the resin layer is cured while maintaining the direct contact with the stamper and the cured resin layer such that the adhesion of the titanium oxide to the resin layer is decreased; and
    separating the stamper from the resin layer.

5. The method according to claim 4,
    wherein the second electrode is a transparent electrode.

6. The method according to claim 4,
    wherein the resin layer comprises a thermosetting resin.

7. A method for manufacturing a light-emitting device, the method comprising: forming a first electrode;
    forming a light-emitting layer over the first electrode;
    forming a second electrode over the light-emitting layer;
    forming a resin layer over the second electrode so as to allow the resin layer to be in direct contact with the second electrode;
    bringing a stamper having a convex-concave surface into contact with the resin layer so that a surface shape of the stamper is transferred to the resin layer;
    heating the stamper to cure the resin layer while keeping the stamper in contact with the resin layer;
    wherein the convex-concave surface is covered by titanium oxide;
    cooling the resin layer while keeping the stamper in contact with the resin layer;
    irradiating the stamper with light after the resin layer is cooled while maintaining the direct contact with the stamper and the cured resin layer such that the adhesion of the titanium oxide to the resin layer is decreased; and
    separating the stamper from the resin layer.

8. The method according to claim 7,
    wherein the second electrode is a transparent electrode.

9. The method according to claim 7,
    wherein the resin layer comprises a thermosetting resin.

* * * * *